(12) United States Patent
Jin et al.

(10) Patent No.: US 8,729,945 B2
(45) Date of Patent: May 20, 2014

(54) PRINTED CIRCUIT BOARD AND METHOD FOR CONTROLLING SIGNAL TIMING SEQUENCE THEREOF

(71) Applicants: Inventec (Pudong) Technology Corporation, Shanghai (CN); Inventec Corporation, Taipei (TW)

(72) Inventors: Xin-Guo Jin, Shanghai (CN); Lian-Yin Zhu, Shanghai (CN); Hui-Yi Wu, Shanghai (CN)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 13/846,135

(22) Filed: Mar. 18, 2013

(65) Prior Publication Data

US 2014/0111264 A1    Apr. 24, 2014

(30) Foreign Application Priority Data

Oct. 22, 2012  (CN) .......................... 2012 1 0403507

(51) Int. Cl.
   *H03H 11/26*     (2006.01)
(52) U.S. Cl.
   USPC .......................................... 327/261; 327/564

(58) Field of Classification Search
   USPC ................................. 327/261, 269, 564, 565
   See application file for complete search history.

(56) References Cited

U.S. PATENT DOCUMENTS 5,857,095 A * 1/1999 Jeddeloh et al. ............... 713/401
8,237,667 B2 * 8/2012 Krah ............................. 345/173

* cited by examiner

*Primary Examiner* — An Luu
(74) *Attorney, Agent, or Firm* — Morris Manning & Martin LLP; Tim Tingkang Xia, Esq.

(57) ABSTRACT

A printed circuit board includes multiple receiving components for respectively receiving control signals and a transmitting component coupled to the receiving component through multiple leads. Given that the lengths of the leads may be different to each other, the control unit generates the control signals to the leads according to the information about the leads, and firstly delivers at least one of the control signals to the corresponding receiving component(s), and then delivers the remaining control signals to the receiving components after a predetermined time. Furthermore, a method for controlling a signal sequence for the printed circuit board includes generating multiple control signals depending on the information about leads and delivering at least one of the control signals to the corresponding receiving component and delivering the remaining control signals to the remaining receiving components after the predetermined time.

9 Claims, 3 Drawing Sheets

PRINTED CIRCUIT BOARD AND METHOD FOR CONTROLLING SIGNAL TIMING SEQUENCE THEREOF

CROSS-REFERENCE TO RELATED APPLICATIONS

This non-provisional application claims priority under 35 U.S.C. §119(a) on Patent Application No(s). 201210403507.2 filed in China, P.R.C. on Oct. 22, 2012, the entire contents of which are hereby incorporated by reference.

BACKGROUND

1. Technical Field

The disclosure relates to a printed circuit board, and more particularly, to a printed circuit board capable of ensuring synchronized receipt of signals and a controlling method for the same printed circuit board.

2. Related Art

A typical process of manufacturing a printed circuit board begins with generating a circuit layout of the printed circuit board in order to generate an electronic document of a layout diagram. In other words, components for the printed circuit board may be virtually placed on the printed circuit board before leads being coupled to the components. The prepared layout is further "Gerbered out" for the preparation of a plurality of corresponding reticle images. Subsequently, the reticle images allow companies specialized in the manufacturing of the printed circuit board to produce the printed circuit boards.

Please refer to FIG. 1, which is a block diagram of a part of a conventional printed circuit board. For ensuring signals to be received by components 112 and 113 from a component 111, the lengths of the leads coupling to the component 111 and the components 112 and 113 may be maintained the same. In order to equalize the lengths between the components 111 and the components 112 and 113, the shape of the leads connected between the components may need some adjustments. In other words, the leads coupling to the components 111 and 112 may be straight lines, when another leads 122 coupling to the components 111 and 113 may be S-shaped, for ensuring the length of the leads 121 and 122 to be substantially the same and therefore the receipt of the signals at the same time.

Such an approach, however, inevitably complicates the design of the printed circuit board and may not utilize the limited space of the printed circuit board in an efficient manner.

SUMMARY

An embodiment of the disclosure provides a printed circuit board comprising a plurality of receiving components and a transmitting component. The plurality of receiving components configured to receive control signals respectively. The transmitting component is coupled to the receiving component through a plurality of leads. The transmitting component associated with a control unit equipped with a look-up table storing information of the leads, wherein when the transmitting component employs the control unit to output the control signals to the receiving component the control unit generates the control signals to the leads according to the information, and delivers at least one of the control signals to at least one to the corresponding receiving component and the remaining control signals to the receiving components delayed by a predetermined time. Furthermore, lengths of the plurality of leads are the same as or different to each other.

Another embodiment of the disclosure provides a method for controlling a signal sequence for the printed circuit board comprises generating a plurality of control signals using a control unit in a transmitting component according to information of leads. The leads are coupled to the transmitting component and a plurality of receiving components. Lengths of the plurality of leads are the same as or different to each other. Subsequently, the method for controlling a signal sequence comprises delivering at least one of the control signals to the corresponding receiving component. Lastly, the method for controlling a signal sequence comprises delivering the remaining control signals to the remaining receiving components delayed by a predetermined time.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

The detailed features and advantages of the disclosure are described below in great detail through the following embodiments, the content of the detailed description is sufficient for those skilled in the art to understand the technical content of the present disclosure and to implement the disclosure there accordingly. Based upon the content of the specification, the claims, and the drawings, those skilled in the art can easily understand the relevant objectives and advantages of the disclosure.

Figure 1:
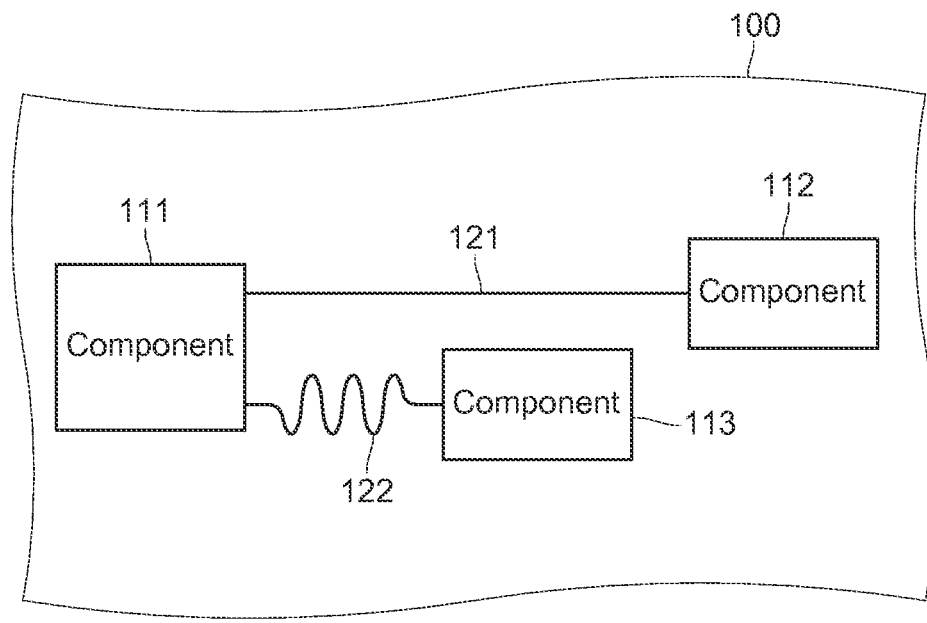
FIG. 1 is a block diagram of a part of a conventional printed circuit board.
Figure 2:
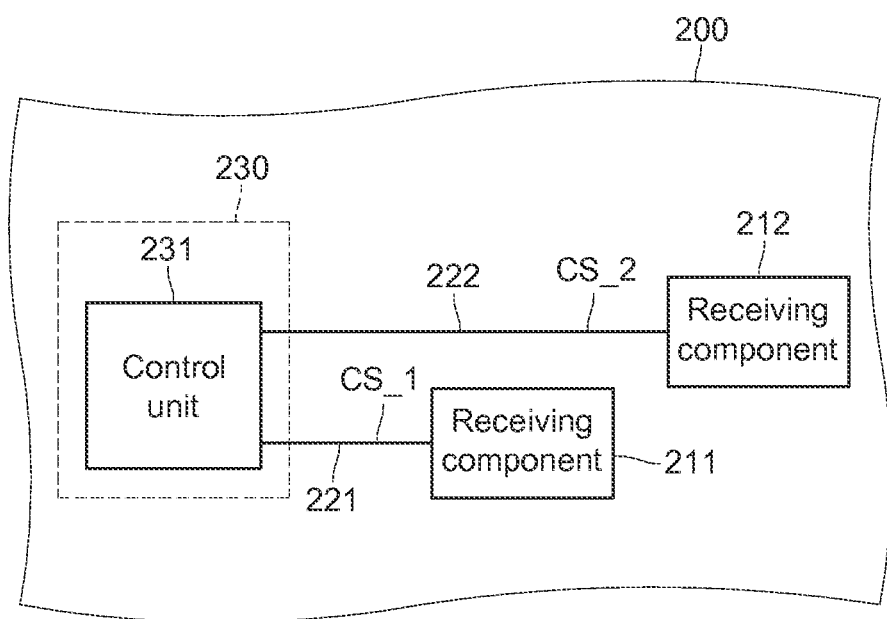
FIG. 2 is a block diagram of a part of a printed circuit board according to one embodiment of the disclosure.

Please refer to FIG. 2, which is a block diagram of a part of a printed circuit board 200 according to the disclosure. The printed circuit board 200 is configured for a motherboard of a computer system or a server. The printed circuit board 200 includes receiving components 211 and 212, leads 221 and 222 along with a transmitting component 230. The receiving components 211 and 212, respectively, through the leads 221 and 222 may be coupled to the transmitting component 230. It is worth noting that signals received by the receiving components 211 and 222 may be synchronized since the signals delivered to the receiving components 211 and 212 are controlled by the transmitting component 230.

For the illustration only, the printed circuit board 200 include two receiving components (i.e., the receiving members 211 and 212), but the disclosure is not limited thereto. In other words, three or more receiving components may be prepared depending on varying needs. Furthermore, the aforementioned receiving members 211 and 212 may be, for example, a central processing unit (CPU) and a hard disk drive respectively.

The disclosure is not limited as the result, since the receiving components 211 and 212 may be other components such as a serial advanced technology attachment (SATA) interface, a peripheral component interconnection express (PCIE) interface, and universal serial bus (USB) interface.

The transmitting component 230 comprises a control unit 231, which may be a micro controller unit (MCU). The control unit 231 is associated with a look-up table in which information of the leads 221 and 222 may be included. At the time the transmitting component 230 outputs multiple control signals to the receiving components 211 and 222, the control unit 231 generates the control signals CS_1 and CS_2 according to the information of the leads 221 and 222.

In one embodiment, the transmitting component 230 is a baseboard management controller (BMC), which may cause the control signals generated by the baseboard management controller via the control unit 231 to be delivered to the corresponding receiving components in a synchronized manner. In another embodiment, for example, the transmitting component 230 is a basic input/output system (BIOS) memory. As such, the control signals generated by the control unit 231 may be simultaneously delivered to the corresponding receiving components from the BIOS memory.

At least one of the control signals CS_1 and CS_2 is delivered to the corresponding receiving component. For example, the control signal CS_2 may be delivered to the receiving component 212 after the delivery of the control signal CS_1 to the receiving component 211. Specifically, the control unit 231 may cause the delivery of the control signal CS_2 to the receiving component 212 after a predetermined time starting from the delivery of the control signal CS_1 to the receiver component 211. The lengths of the leads 221 and 222 may be the same or different from each other. Furthermore, the information of the leads 221 and 222 may include the aforementioned length of the leads 221 and 222 and transmission speeds of the control signal CS_1 and CS_2 traveling along the leads 221 and 222.

For example, assume the length of the lead 221 may be 2 Mils and the time for the control signal CS_1 to travel through the lead 221 may be 2 nanoseconds, which may correspond to the transmission speed of the control signal CS_1 traveling along the lead 221. On the other hand, the length of the lead 222 may be 4 Mils with the time for the control signal CS_2 traveling through the lead 222 being 3 nanoseconds, which may correspond to the transmission speed of the control signal CS_2 traveling along the lead 222. Accordingly, the predetermined time may be the difference between the length of the lead 221 and the length of the lead 222, divided by the transmission speed of the control signal traveling along the lead 222, Plus, The length of the lead 221 is greater than the length of the lead 222.

When the transmitting component 230 through the control unit 231 outputs the control signals to the leads 221 and 222, the control unit 231 generates the control signals such as CS_1 and CS_2 based on the information of the leads 221 and 222 before delivering one of the control signals such as CS_1 or CS_2 to the corresponding receiving component 212 (e.g., the hard disk). After being delayed for the predetermined time, the control unit 231 may further deliver the remaining control signal(s) such as CS_1 or CS_2 to its corresponding receiving component 211 (e.g., the CPU).

Since the control unit 231 may access the look-up table to retrieve the information of the leads 221 and 222 including the length of the leads (e.g., 2 Mils for the lead 221 and 4 Mils for the lead 222) and the transmission speed of the control signals CS_1 and CS_2 traveling in the leads 221 and 222 (e.g., 2 nanoseconds for the lead 221 and 3 nanoseconds for the lead 222), the control unit 231 therefore determines the predetermined time by further calculating the difference between the length of the lead 221 and the length of the lead 222 divided by the transmission speed of the control signal CS2_2. As such, the aforementioned predetermined time may be set to 1 nanoseconds (that is, (4−2)/2=1).

Under this arrangement, the control unit 231 first outputs the control signal CS_2, and transfers the control signal CS_2 through the lead 222 to the receiving component 212. Subsequently, the control unit 231 delays the control signal CS_1 for the predetermined time namely one nanosecond in this example before outputting the control signal CS_1 through the lead 221 to the receiving component 211. Consequently, the control signals CS_1 and CS_2 generated by the control unit 231 may simultaneously reach to the receiving components 211 and 212, in order to synchronize the receipt of the transmission of the control signals.

In another embodiment, when the lengths of the leads 221 and 222 are both 4 Mils and the transmission speeds of the control signals CS_1 and CS_2 traveling in the leads 221 and 222 are both 2 nanoseconds, the control unit 231 may generate the control signals CS_1 and CS_2 at the same time without any delay as no difference between the length of the lead 221 and the length of the lead 222. Plus, considering the same transmission speeds of the control signals CS_1 and CS_2, the control signals CS_1 and CS_2 may be both transmitted through the leads 221 and 222 and both reach the receiving components 211 and 212 simultaneously, achieving the signal synchronization.

In another embodiment, the information of the leads 221 and 222 may include time length of the control signals CS_1 and CS_2 delivered to the receiving components 211 and 212.

For example, assume the time length of the control signal CS_1 is 2 nanoseconds and the time length of the control signal CS_2 is 3 nanoseconds. The predetermined time in this example is the difference between the time length of the control signal CS_1 and the time length of the control signal CS_2. The time length of the control signal CS_1 is referred to as a first time length, while the time length of the control signal CS_2 is referred to as a second time length. The first time length is the time length of the control signal that is delivered without delaying by any predetermined time as well as the second time length therefore refers to the time length of the control signal that is delivered after the predetermined time of the delivery of the control signal without such a time delay. Furthermore, the first time length is greater than the second time length.

Since the control unit 231 may access the look-up table to retrieve the information of the leads 221 and 222, the control unit 231 may acknowledge the first time length and the second time length, which are 2 nanoseconds and 3 nanoseconds respectively. And the difference between the first time length and the second time length may become 1 nanosecond, which may further serve as the predetermined time in the disclosure.

That is, the control unit 231 may first output the control signal CS_2, and transfer the same control signal CS_2 through the lead 222 to the receiving component 212. Subsequently, the control unit 231 may delay the control signal CS_1 for one nanosecond, before outputting the same control signal CS_1 through the lead 221 to the receiving component 211. Consequently, the control signals CS_1 and CS_2 generated by the control unit 231 may simultaneously reach the receiving components 211 and 212, in order to synchronize the receipt of the transmission of the control signals.

Moreover, the control unit 231 may generate a plurality of test signals, which may be transmitted through the leads 221 and 222 before reaching the receiving members 211 and 212. The receiving components 211 and 212, in response to the receipt of the test signals, may generate corresponding response signals to the control unit 231.

Based on the received response signals, the control unit 231 thereafter prepares the information regarding the leads 221 and 222 of the receiving components 211 and 212 before storing the same information. Specifically, the control unit 231 may calculate the lengths of the leads 221 and 222 and the transmission speeds of the control signals CS_1 and CS_2 according to when the test signals are issued to the receiving components 211 and 212 and when the corresponding response signals are received.

In another embodiment, the information of the leads 221 and 222 may be obtained after the completion of the layout of the printed circuit board 200 before being stored into the control unit 231. In this way, the goal of the synchronization of the signal transmission when the printed circuit board 200 is in operation may be achieved as well.

Figure 3:
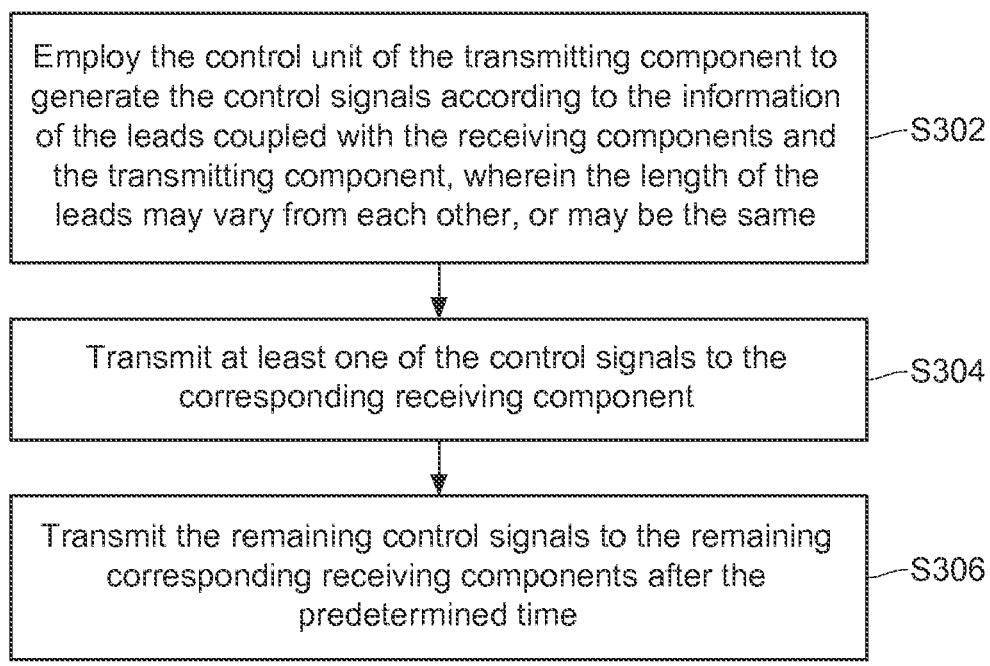
FIG. 3 is a flow chart of a method of controlling a signal timing sequence of a printed circuit board according to one embodiment of the disclosure.

Based on aforementioned embodiments, a method for controlling signal sequence may be generated. Please refer to FIG. 3, which is a flow chart of a method of controlling a signal timing sequence of the printed circuit board according to one embodiment of the disclosure. In step S302, the method includes employing the control unit of the transmitting component, according to the information of the leads coupling the receiving components and the transmitting component to generate the control signals. The lengths of the leads may vary from each other, or the same in another embodiment. In step S304, the method may cause the control unit to transmit at least one of the control signals to the corresponding receiving component. In step S306, the method further includes causing the control unit to transmit the remaining control signals to the remaining corresponding receiving components after the predetermined time.

In one embodiment, the aforementioned information of the leads may include the lengths of the leads including the length of the lead 221 (or the lead 221 length) and the length of the lead 222 (or the lead 222 length) and the transmission speeds of the control signals traveling in the lead 221 and the lead 222. The, predetermined time as previously mentioned may be the difference between the lead 221 length and the lead 222 length divided by the transmission speed of the control signal traveling in the lead with the predetermined time. The lead in which the control signal travels with the predetermined time is the lead 221 associated with the lead 221 length. The lead in which the control signal travels without the predetermined time (or the delivery of this particular control signal is ahead of the delivery of the control signal with the predetermined time) is the lead 222 with the lead 222 length. Further, the lead 221 length is greater than the lead 222 length.

In another embodiment, the information of the leads may also include the time length of the control signals. And the predetermined time is the difference between the first time length and the second time length. The first time length is the time length of the control signal that is delivered without the predetermined time, and the second time length is the time length of the control signal that is delivered with the predetermined time. In addition, the first time length is greater than the second time length.

Figure 4:
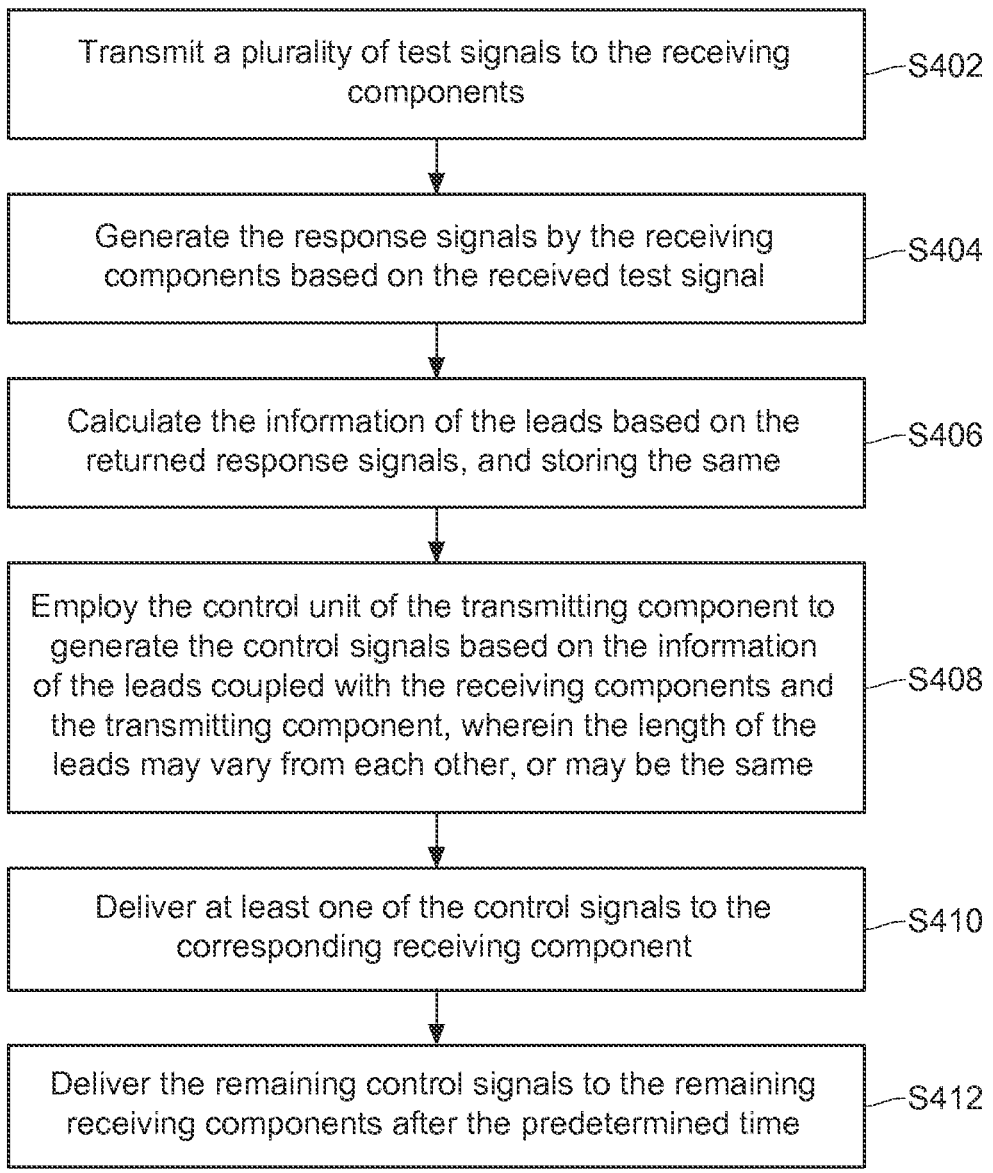
FIG. 4 is a flow chart of a method of controlling a signal timing sequence of a printed circuit board according to another embodiment of the disclosure.

Please refer to FIG. 4, which is a flowchart of a method of controlling the signal timing sequence of another printed circuit board according to another embodiment of the disclosure. In step S402, the method includes causing the control unit to transmit a plurality of test signals to the receiving components. In step S404, the receiving components based on the received test signal generate the response signals. In step S406, the method includes calculating/determining the information of the leads based on the returned response signals, and storing the same.

In step S408, the method further employs the control unit of the transmitting component to generate the control signals based on the information of the leads, wherein the control signals may not be generated simultaneously in some embodiments though being generated at the same time in other embodiments, depending on the information of the leads. In step S410, the method causes the control signals to be delivered to the corresponding receiving components and the delivery of the control signals may happen either at the same time or not. In step S412, the method delivers the remaining control signals to the remaining receiving components after the predetermined time.

In another embodiment, the information about the lead includes the length of the lead 221 and the length of the lead 222 along with the transmission speed of the control signals traveling in both the lead 221 and the lead 222. Additionally, the predetermined time is the difference between the length of the lead 221 and the length of the lead 222 divided by the transmission speed of the control signal traveling in the lead with the predetermined time. In some embodiments, since the lead 221 length may be greater than the lead 222 length for ensuring the synchronization of the receipt of the control signals, the delivery of the control signal to the receiving component coupled to the lead 221 may be ahead of the delivery of the control signal to the receiving component coupled to lead 222.

In another embodiment, the information of the leads includes the time length of the control signals with the predetermined time set to the difference between the time length of the control signal transmitted to the lead 221 (or the first time length) and the time length of the control signal transmitted to the lead 222 (or the second time length). Further, the delivery of the control signal to the lead 221 is ahead of the delivery of the control signal to the lead 222, when the first time length is greater than the second time length.

Accordingly, the printed circuit board disclosed in the disclosure or the signal timing sequence method utilized for such printed circuit board enables the synchronized receipt of the control signals by separating the delivery of one control signal from the transmitting component to the corresponding receiving component from the delivery of another control signal from the transmitting component to another receiving component based on the information of the leads coupling the transmitting component and the receiving components. As such, the design for the layout of the printed circuit board may be simplified, and the layout efficiency of the printed circuit board and the use of the limited space of the printed circuit board may improve.

The disclosure may be embodied in other specific forms without departing from its spirit or essential characteristics. The described embodiments are to be considered in all respects only as illustrative and not restrictive. The scope of the invention is, therefore, indicated by the appended claims rather than by the foregoing description.

What is claimed is:

1. A printed circuit board comprising:
   a plurality of receiving components configured to receive control signals respectively; and
   a transmitting component coupled to the receiving components through at least two leads respectively, the transmitting component including a control unit equipped with a look-up table storing information of the leads, wherein when the transmitting component employs the control unit to output the control signals to the receiving components, the control unit generates said control signals according to the information of the leads, said control unit delivers at least one of the control signals to the corresponding receiving component through a corresponding lead, and delivers the remaining control signals to the other receiving components through other corresponding leads to delay by a predetermined time; wherein the lengths of the leads are different to each other.

2. The printed circuit board according to claim 1, wherein the information of the leads includes the length of the leads and transmission speeds of the control signals traveling along the leads, and the predetermined time is a difference between a first length and a second length divided by the transmission speed of the control signals traveling along the lead with delaying by the predetermined time, and wherein the first length corresponds to the length of some of the leads where the control signal travels without delaying by the predetermined time, the second length corresponds to the length of the remaining lead where the control signal travels with delaying by the predetermined time, and wherein the first length is greater than the second length.

3. The printed circuit board according to claim 1, wherein the information includes time lengths of the control signals provided to each of the receiving components, the predetermined time is a difference between a first time length and a second time length, the first time length corresponds to the time length of the control signal received by some of the lead without delaying, the second time length corresponds to the time length of the control signal received the remaining lead with delaying, and the first time length is greater than the second time length.

4. The printed circuit board according to claim 1, wherein the control unit is configured to transmit a plurality of test signals to the receiving components respectively, which are configured to generate response signals to the control unit, and the control unit according to the response signals is configured to calculate the information of the leads corresponding to the receiving components and to store the information of the leads.

5. The printed circuit board according to claim 1, wherein the transmitting component is a baseboard management controller or a basic input/output system memory.

6. A method for controlling a signal sequence for a printed circuit board, comprising:

generating a plurality of control signals by a control unit of a transmitting component according to information of leads coupled to the transmitting component and a plurality of receiving components, wherein lengths of the leads are different to each other;

delivering at least one of the control signals to the corresponding receiving component; and delivering the remaining control signals to the remaining receiving components delayed by a predetermined time.

7. The method according to claim 6, wherein the information of the leads includes the lengths of the leads and transmission speeds of the control signals traveling along the leads, and the predetermined time is a difference between a first length and a second length divided by the transmission speed of the control signals traveling along the lead with delaying by the predetermined time, and wherein the first length corresponds to the length of some of the lead where the control signal travels without delaying by the predetermined time, and the second length corresponds to the length of the remaining lead where the control signal travels with delaying by the predetermined time, and wherein the first length is greater than the second length.

8. The method according to claim 6, wherein the information includes time lengths of the control signals provided to the receiving components, the predetermined time is a difference between a first time length and a second time length, the first time length corresponds to the time length of the control signal received by the some of the lead without the delay and the second time length corresponds to the time length of the control signal received by the remaining lead with the delay, and the first time length is greater than the second time length.

9. The method according to claim 6, further comprising:
transmitting a plurality of test signals to the receiving components,
generating a response signal according to the test signals by the receiving components, respectively; and
calculating the information of the leads corresponding to the receiving components according to the response signals and storing the information of the leads.

* * * * *